United States Patent
Jo et al.

(10) Patent No.: US 10,396,765 B2
(45) Date of Patent: Aug. 27, 2019

(54) POWER AMPLIFYING APPARATUS WITH SPURIOUS SIGNAL REDUCTION FUNCTION

(71) Applicant: SAMSUNG ELECTRO-MECHANICS CO., LTD., Suwon-si (KR)

(72) Inventors: Byeong Hak Jo, Suwon-si (KR); Jeong Hoon Kim, Suwon-si (KR); Hyun Paek, Suwon-si (KR); Jong Ok Ha, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/801,137

(22) Filed: Nov. 1, 2017

(65) Prior Publication Data

US 2018/0287595 A1    Oct. 4, 2018

(30) Foreign Application Priority Data

Mar. 31, 2017 (KR) .................. 10-2017-0041600

(51) Int. Cl.
*H03K 5/1252* (2006.01)
*H03F 3/19* (2006.01)
(Continued)

(52) U.S. Cl.
CPC ............ *H03K 5/1252* (2013.01); *H02M 3/07* (2013.01); *H03F 1/0261* (2013.01); *H03F 3/19* (2013.01); *H03F 3/21* (2013.01); *H03F 3/245* (2013.01); *H03K 3/354* (2013.01); *H03K 3/84* (2013.01); *H03K 4/08* (2013.01); *H02M 1/44* (2013.01); *H02M 2001/0045* (2013.01); *H02M 2003/071* (2013.01); *H03F 2200/105* (2013.01); *H03F 2200/339* (2013.01); *H03F 2200/351* (2013.01);
(Continued)

(58) Field of Classification Search
USPC ................................ 330/297, 127, 134, 279
See application file for complete search history.

(56) References Cited

U.S. PATENT DOCUMENTS

| | | | |
|---|---|---|---|
| 5,168,174 A | 12/1992 | Naso et al. | |
| 6,825,726 B2 * | 11/2004 | French | H03F 1/0227 323/222 |
| 9,859,852 B2 * | 1/2018 | Anderson | H03F 1/0227 |

FOREIGN PATENT DOCUMENTS

| | | |
|---|---|---|
| KR | 10-1993-0010277 B1 | 10/1993 |
| KR | 10-2014-0059251 A | 5/2014 |
| WO | WO 2013/033214 A2 | 3/2013 |

OTHER PUBLICATIONS

Korean Office Action dated Feb. 8, 2018 in counterpart Korean Patent Application No. 10-2017-0041600 (14 pages, with English translation).

(Continued)

*Primary Examiner* — Hieu P Nguyen
(74) *Attorney, Agent, or Firm* — NSIP Law (57) ABSTRACT

A power amplifying apparatus includes a power circuit configured to generate operating power, a random pulse generation circuit configured to be supplied with the operating power and to generate a pulse width modulation signal of which a pulse width is randomly changed over time using an input radio frequency (RF) signal, and a charge pump circuit configured to be supplied with the operating power and to randomly perform a switching operation according to the pulse width modulation signal to generate a negative voltage.

20 Claims, 10 Drawing Sheets

(51) Int. Cl.
  *H03F 3/21* (2006.01)
  *H02M 3/07* (2006.01)
  *H03K 3/354* (2006.01)
  *H03K 3/84* (2006.01)
  *H03K 4/08* (2006.01)
  *H03F 1/02* (2006.01)
  *H03F 3/24* (2006.01)
  H02M 1/44 (2007.01)
  H03K 3/03 (2006.01)
  H03K 7/08 (2006.01)
  H03K 17/28 (2006.01)
  H02M 1/00 (2006.01)

(52) U.S. Cl.
  CPC ...... *H03F 2200/451* (2013.01); *H03K 3/0315* (2013.01); *H03K 7/08* (2013.01); *H03K 17/28* (2013.01)

(56) References Cited

OTHER PUBLICATIONS

Tanaka, Tetsuro, et al. "Random-Switching Control In Dc-To-Dc Converters." *Power Electronics Specialists Conference, 1989. PESC'89 Record., 20th Annual IEEE.* IEEE, 1989. (9 pages, in English).

* cited by examiner

POWER AMPLIFYING APPARATUS WITH SPURIOUS SIGNAL REDUCTION FUNCTION

CROSS-REFERENCE TO RELATED APPLICATIONS

This application claims the benefit under 35 USC 119(a) of Korean Patent Application No. 10-2017-0041600 filed on Mar. 31, 2017 in the Korean Intellectual Property Office, the entire disclosure of which is incorporated herein by reference for all purposes.

BACKGROUND

1. Field

The following description relates to a power amplifying apparatus having a spurious signal reduction function.

2. Description of Related Art

A power amplifying apparatus manufactured as a module is generally known as a power amplifier module (PAM). A PAM may amplify a radio frequency (RF) signal of an output of a transmitter and transmit the amplified RF signal to an antenna. Such a PAM may include switches and filters and a power amplifier (PA) that amplifies the RF signal to support various frequency bands.

The signal amplified by the PA may pass through the respective appropriate filters through a band selection switch (BSSW) and may be then transmitted to the antenna via an antenna switch module (ASM). In this example, the BSSW and the ASM may include an RF switch to select an appropriate band.

In order to significantly reduce an influence by a switched-off path other than a path selected by such an RF switch, the RF switch may use a negative voltage (VNEG) or VDD negative (−VDD).

As such, the negative voltage, for example, VNEG, used by the RF switch is applied to a gate and a body of the switch in the switched-off path to improve characteristics of the switch. In this example, the negative voltage is generated using an oscillator (OSC) and a charge pump (CP), the oscillator generates a clock signal, and the charge pump performs charging and discharging for a capacitor using the clock signal to generate the negative voltage, for example, VNEG.

In this example, a spurious signal generated along with the clock signal is introduced into the charge pump, the oscillator, and a power circuit, for example, a voltage regulator such as a low-dropout regulator (LDO) supplying operating power to the charge pump. For example, an LDO is a DC linear voltage regulator is that is able to regulate an output voltage even when a supply voltage is very close to the output voltage. As a result, there may be an issue in which the operating power becomes unstable due to spurious signals.

An amount of spurious signals as described above may not be high, and because a filter filtering a signal of a corresponding frequency is embedded in a frequency division duplex (FDD) mode using different frequencies, the spurious signals may not be a significant problem in FDD mode.

However, because a time division duplex (TDD) mode uses the same frequency for transmission, there is a potential issue when operating in TDD mode that the spurious signals of the charge pump may be generated, which may adversely affect the successful operation of the power circuit described above.

As an example, in an example PAM system, a controller controls an application of an appropriate bias to the power amplifier (PA) using a mobile industry processor interface (MIPI), and controls a selection of an appropriate band by applying a band selection signal to the BSSW so that an output signal of the power amplifier (PA) is provided to the filter of the appropriate band. In addition, the controller controls a switching operation of the BSSW by applying a positive voltage, for example, the LDO voltage, and the negative voltage, for example, VNEG, output by the charge pump to the BSSW for performing an on/off operation.

However, in such a PAM system, there may be an issue in which spurious signals, such as clock noise, corresponding to the operation frequencies of the oscillator and the charge pump, are generated along with an output of the power circuit such as an LDO, or the like as discussed above, and along with an output of the charge pump.

In addition, such spurious signals potentially appear in the output of the BSSW in various paths. In an example in which the spurious signal appears in a received band frequency, there is a potential issue in which the spurious signal is a factor that deteriorates sensitivity.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a power amplifying apparatus includes a power circuit configured to generate operating power, a random pulse generation circuit configured to be supplied with the operating power and to generate a pulse width modulation signal of which a pulse width is randomly changed over time using an input radio frequency (RF) signal, and a charge pump circuit configured to be supplied with the operating power and to randomly perform a switching operation according to the pulse width modulation signal to generate a negative voltage.

The random pulse generation circuit may include a rectifier configured to rectify the input RF signal to provide an envelope voltage having an envelope level of the RF signal, and a pulse width modulator configured to provide the pulse width modulation signal of which the pulse width is randomly varied based on the envelope voltage provided by the rectifier.

The random pulse generation circuit may further include a dead time controller configured to provide first and second random switching signals having an antiphase with respect to each other and having a dead time with respect to the charge pump circuit based on the pulse width modulation signal.

The pulse width modulator may include a reference voltage generation circuit configured to generate a reference voltage, and a pulse width modulation signal generation circuit configured to compare the envelope voltage from the rectifier and the reference voltage with each other to generate the pulse width modulation signal of which the pulse width is randomly varied.

The random pulse generation circuit may include a rectifier configured to rectify the input RF signal to provide an envelope voltage having an envelope level of the RF signal, a pulse width modulator configured to provide pulse width modulation signals of which the pulse width is randomly varied according to the envelope voltage from the rectifier, and an oscillator configured to provide an oscillated signal according to a random charging and discharging operation based on the pulse width modulation signals.

The pulse width modulator may include a reference voltage generation circuit configured to generate reference voltages having different magnitudes, and a pulse width modulation signal generation circuit configured to compare the envelope voltage from the rectifier and each of the reference voltages to generate pulse width modulation signals having different pulse widths.

The pulse width modulator may include a reference voltage generation circuit configured to generate reference voltages having different magnitudes, a sawtooth wave generation circuit configured to generate a sawtooth wave signal based on the envelope voltage from the rectifier, and a pulse width modulation signal generation circuit configured to compare the sawtooth wave signal and each of the reference voltages to generate pulse width modulation signals having different pulse widths.

The oscillator may be a ring oscillator comprising metal-oxide-semiconductor (MOS) transistors each configured to operate in an on-state during different times based on the pulse width modulation signals.

The rectifier may include a diode, a capacitor, and a resistor.

In another general aspect, a power amplifying apparatus includes a power circuit configured to generate operating power, a bias circuit configured to be supplied with the operating power and to generate a bias signal, a random pulse generation circuit configured to be supplied with the operating power and to generate a pulse width modulation signal of which a pulse width is randomly changed over time using an input radio frequency (RF) signal, a charge pump circuit configured to be supplied with the operating power and to randomly perform a switching operation according to the pulse width modulation signal to generate a negative voltage, a power amplifier configured to be provided with the operating power and the bias signal, and to amplify the RF signal, and a band selection switch configured to perform a band selection operation based on the operating power and the negative voltage, and to transfer the RF signal from the power amplifier.

The random pulse generation circuit may include a rectifier configured to rectify the input RF signal to provide an envelope voltage having an envelope level of the RF signal, and a pulse width modulator configured to provide the pulse width modulation signal of which the pulse width is randomly varied according to the envelope voltage from the rectifier.

The random pulse generation circuit may include a rectifier configured to rectify the input RF signal to provide an envelope voltage having an envelope level of the RF signal, a pulse width modulator configured to provide pulse width modulation signals of which the pulse width is randomly varied according to the envelope voltage from the rectifier, and an oscillator configured to provide an oscillated signal according to a random charging and discharging operation based on the pulse width modulation signals.

The oscillator may be a ring oscillator including metal-oxide-semiconductor (MOS) transistors each configured to operate in an on-state during different times based on the pulse width modulation signals.

The rectifier may include a diode, a capacitor, and a resistor.

The random pulse generation circuit may further include a dead time controller configured to provide first and second random switching signals having an antiphase with respect to each other and having a dead time with respect to the charge pump circuit based on the pulse width modulation signal.

The pulse width modulator may include a reference voltage generation circuit configured to generate a reference voltage, and a pulse width modulation signal generation circuit configured to compare the envelope voltage from the rectifier and the reference voltage with each other to generate the pulse width modulation signal of which the pulse width is randomly varied.

The pulse width modulator may include a reference voltage generation circuit configured to generate reference voltages having different magnitudes, and a pulse width modulation signal generation circuit configured to compare the envelope voltage from the rectifier and each of the reference voltages to generate pulse width modulation signals having different pulse widths.

The pulse width modulator may include a reference voltage generation circuit configured to generate reference voltages having different magnitudes, a sawtooth wave generation circuit configured to generate a sawtooth wave signal based on the envelope voltage from the rectifier, and a pulse width modulation signal generation circuit configured to compare the sawtooth wave signal and each of the reference voltages to generate pulse width modulation signals having different pulse widths.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

Figure 1:
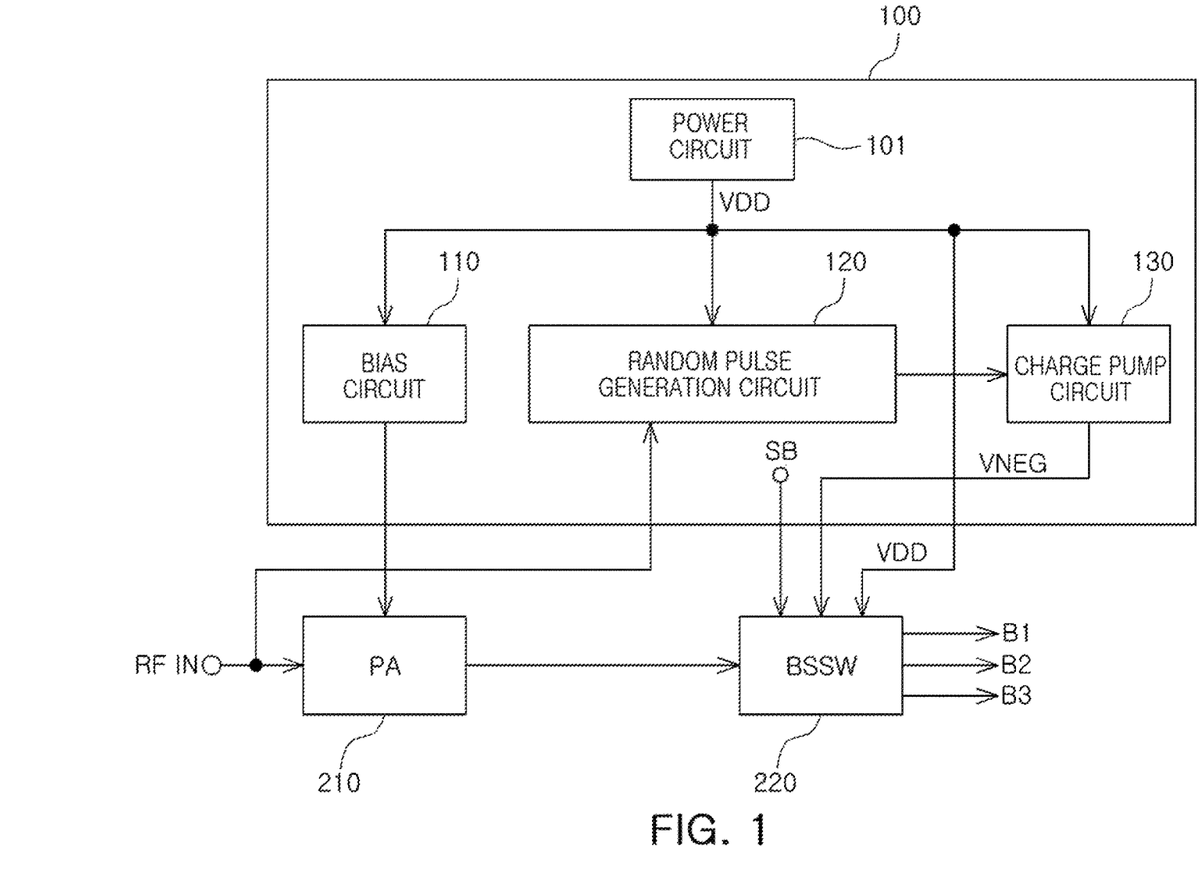
FIG. 1 is a block diagram of a power amplifying apparatus according to an example.

FIG. 1 is a block diagram of a power amplifying apparatus according to an example.

Referring to the example of FIG. 1, a power amplifying apparatus according to an example includes a power circuit 101, a random pulse generation circuit 120, and a charge pump circuit 130.

In addition, the power amplifying apparatus according to such an example optionally further includes the power circuit 101, a bias circuit 110, a power amplifier 210, and a band selection switch 220.

As an example, the power circuit 101, the bias circuit 110, the random pulse generation circuit 120, and the charge pump circuit 130 are included in a controller 100. In such an example, the controller 100 includes a mobile industry processor interface (MIPI), and controls an application of an appropriate bias to the power amplifier (PA) and a band selection using the MIPI.

Thus, in such an example, the power circuit 101 generates an operating power VDD and provides the operating power VDD to the power circuit 101, the random pulse generation circuit 120, the charge pump circuit 130, the power amplifier 210, and the band selection switch 220.

For example, the power circuit 101 includes a low drop output (LDO) that down-converts a voltage while having a low consumption of current.

In such an example, the bias circuit 110 is supplied with the operating power VDD from the power circuit 101, and generates a bias signal to supply the bias signal to the power amplifier 210.

In this example, the random pulse generation circuit 120 is supplied with the operating power VDD from the power circuit 101, and generates a pulse width modulation signal VPWM having a pulse width that is randomly changed over time using the input RF signal.

Accordingly, the charge pump circuit 130 is supplied with the operating power VDD, and randomly performs a switching operation according to the pulse width modulation signal VPWM from the random pulse generation circuit 120 to generate a negative voltage VNEG.

Thus, as the charge pump circuit 130 randomly performs the switching operation according to the pulse width modulation signal VPWM, the spurious signals generated in an example in which the charge pump circuit 130 is operated at a constant frequency are potentially not generated.

In such an example, the power amplifier 210 is provided with the operating power VDD from the power circuit 101 and the bias signal from the bias circuit 110, and amplifies the input RF signal to transfer the amplified RF signal to the band selection switch 220.

Accordingly, the band selection switch 220 performs a band selection operation based on a band selection signal SB, the operating power VDD from the power circuit 101, and the negative voltage VNEG from the charge pump circuit 130. Based on the band selection operation, the band selection switch transfers the corresponding band signal B1, B2, or B3 selected from among the RF signals from the power amplifier 210.

In the respective drawings of the present disclosure, unnecessary overlapped descriptions are omitted, for brevity, for certain components having the same reference numeral and the same function, and differences are further described.

Figure 2:
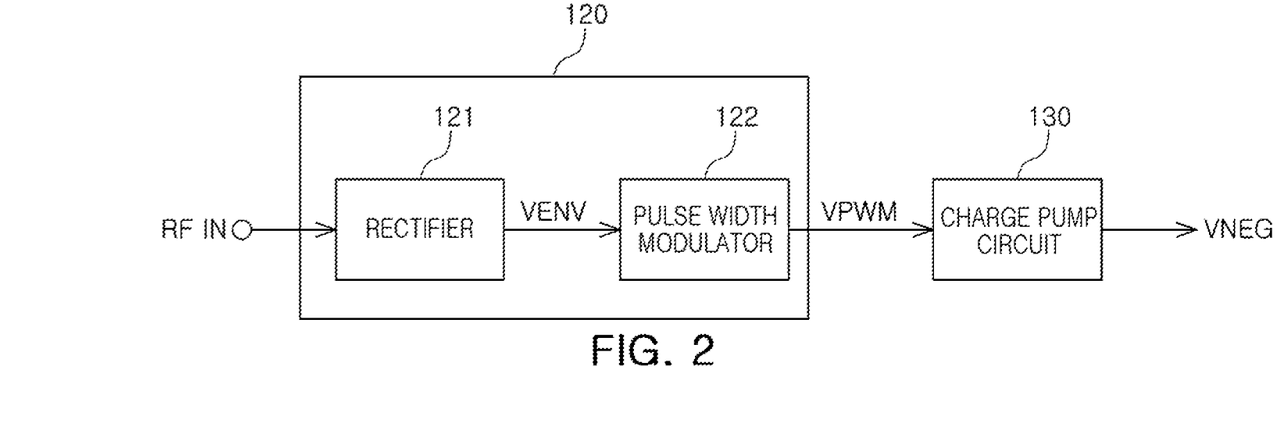
FIG. 2 is a diagram illustrating a random pulse generation circuit according to an example.
Figure 3:
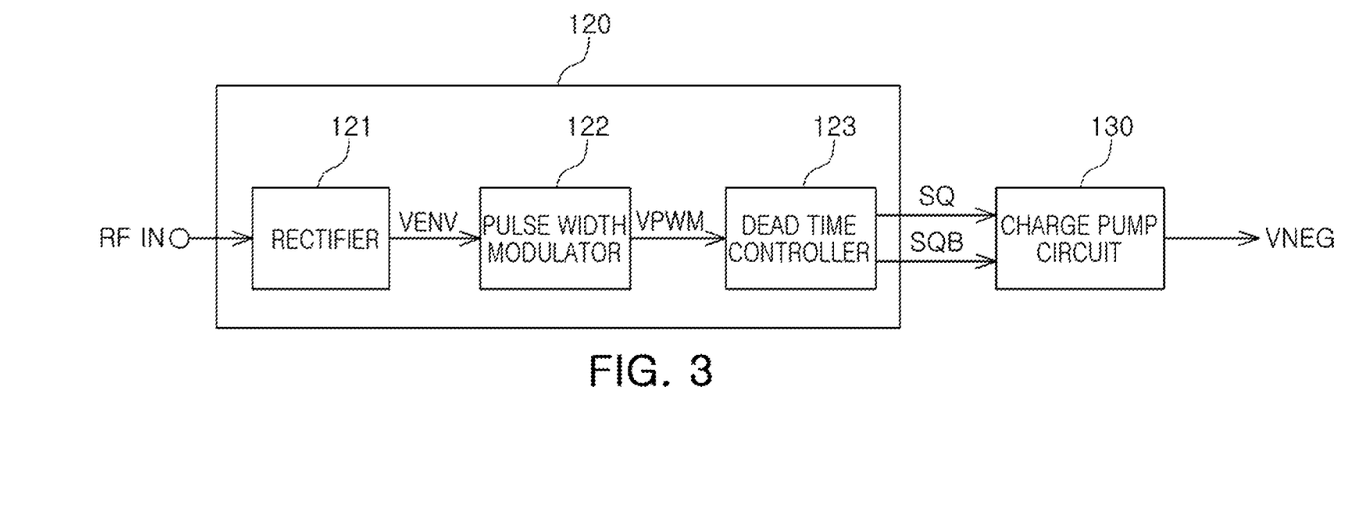
FIG. 3 is another diagram illustrating the random pulse generation circuit according to an example.

FIG. 2 is a diagram illustrating a random pulse generation circuit according to an example and FIG. 3 is another diagram illustrating the random pulse generation circuit according to an example.

Referring to the example of FIG. 2, the random pulse generation circuit 120 includes a rectifier 121 and a pulse width modulator 122.

In the example of FIG. 2, the rectifier 121 rectifies the input RF signal to provide an envelope voltage VENV having an envelope level of the RF signal. An example of such a rectification process is described further with reference to the example of FIG. 5.

According to FIG. 2, the pulse width modulator 122 provides the pulse width modulation signal VPWM having the pulse width that is randomly varied according to the envelope voltage VENV from the rectifier 121. An example of such operation is described further with reference to FIGS. 5 and 9 through 11.

Referring to the example of FIG. 3, the random pulse generation circuit 120 includes the rectifier 121, the pulse width modulator 122, and a dead time controller 123.

In such an example, the dead time controller 123 provides first and second random switching signals SQ and SQB that have an antiphase with respect to each other and have a dead time with respect to the charge pump circuit 130 based on the pulse width modulation signal VPWM.

Figure 7:
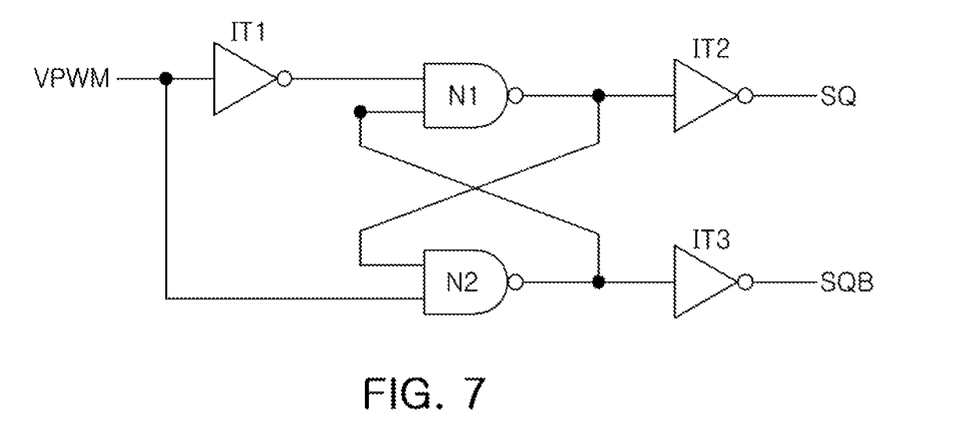
FIG. 7 is a circuit diagram implementing the random pulse generation circuit of the example of FIG. 3.
Figure 8:
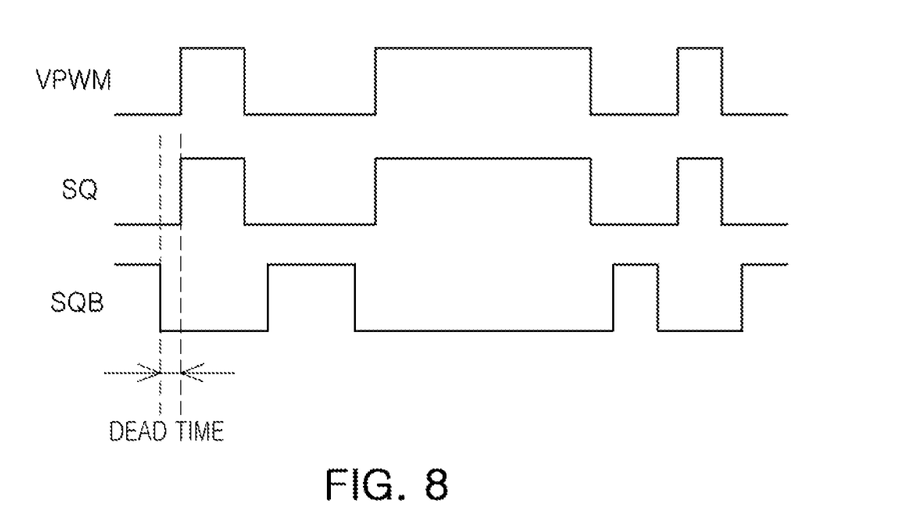
FIG. 8 is a diagram illustrating first and second random switching signals of the example of FIG. 7.

Such a relationship between the random switching signals SQ and SQB is described further with reference to the examples of FIGS. 7 and 8.

Figure 4:
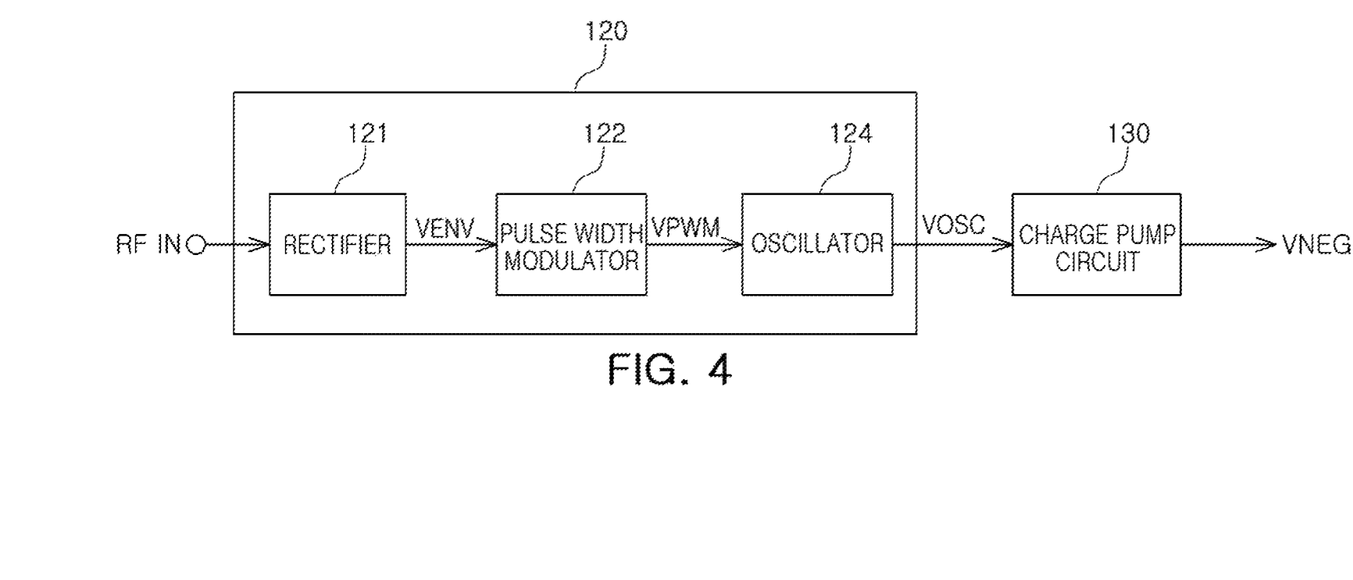
FIG. 4 is another diagram illustrating the random pulse generation circuit according to an example.

FIG. 4 is another diagram illustrating the random pulse generation circuit according to an example. Referring to the example of FIG. 4, the random pulse generation circuit 120 includes the rectifier 121, the pulse width modulator 122, and an oscillator 124.

In the example of FIG. 4, the rectifier 121 rectifies the input RF signal to provide the envelope voltage VENV having the envelope level of the RF signal. An example of such rectifying is described further with reference to the example of FIG. 5.

The pulse width modulator 122 provides the pulse width modulation signal VPWM, having the pulse width that is randomly varied according to the envelope voltage VENV, from the rectifier 121. An example of such a process is described further with reference to the examples of FIGS. 5 and 9 through 11.

In the example of FIG. 4, the oscillator 124 provides an oscillated signal VOSC, according to a random charging and discharging operation, based on the pulse width modulation signals VPWM1, VPWM2, and VPWM3. An example of such operation of the oscillator 124 is described further with reference to the examples of FIGS. 10 and 11.

Figure 5:
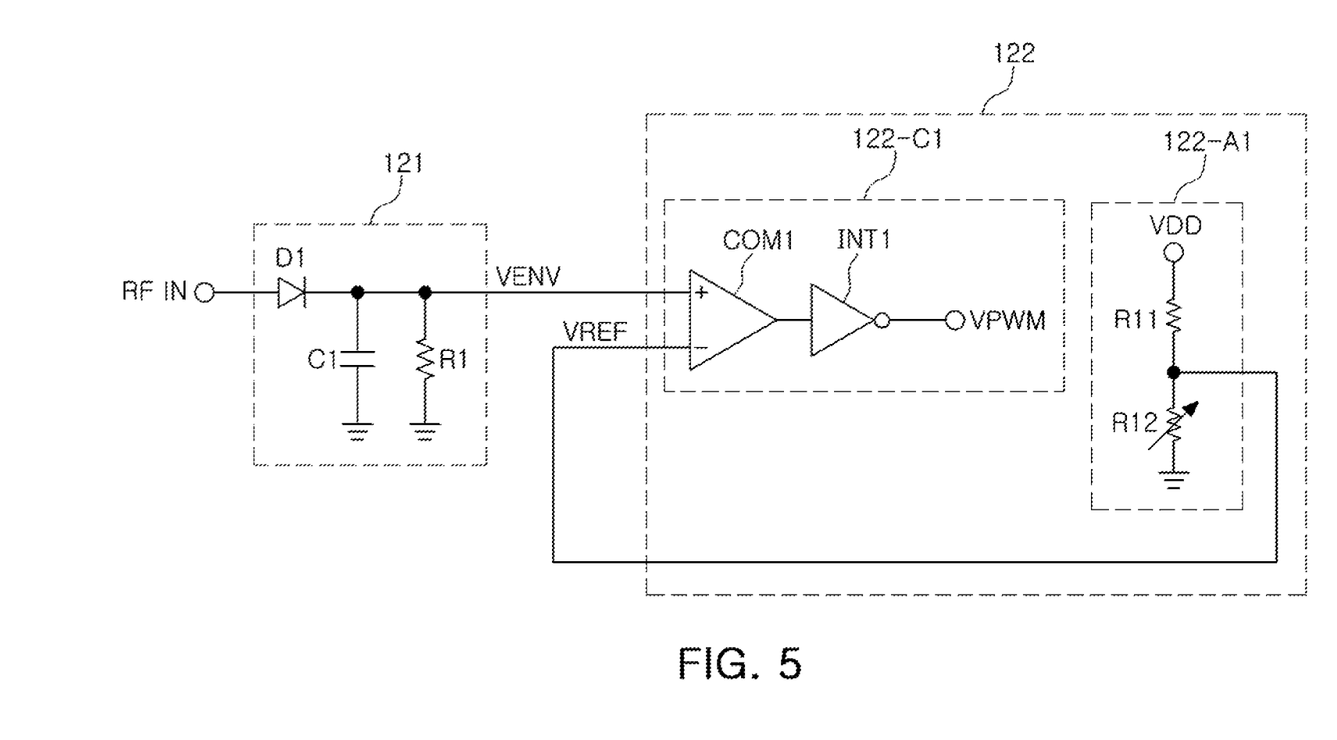
FIG. 5 is a circuit diagram implementing the random pulse generation circuit of the example of FIG. 2.
Figure 6:
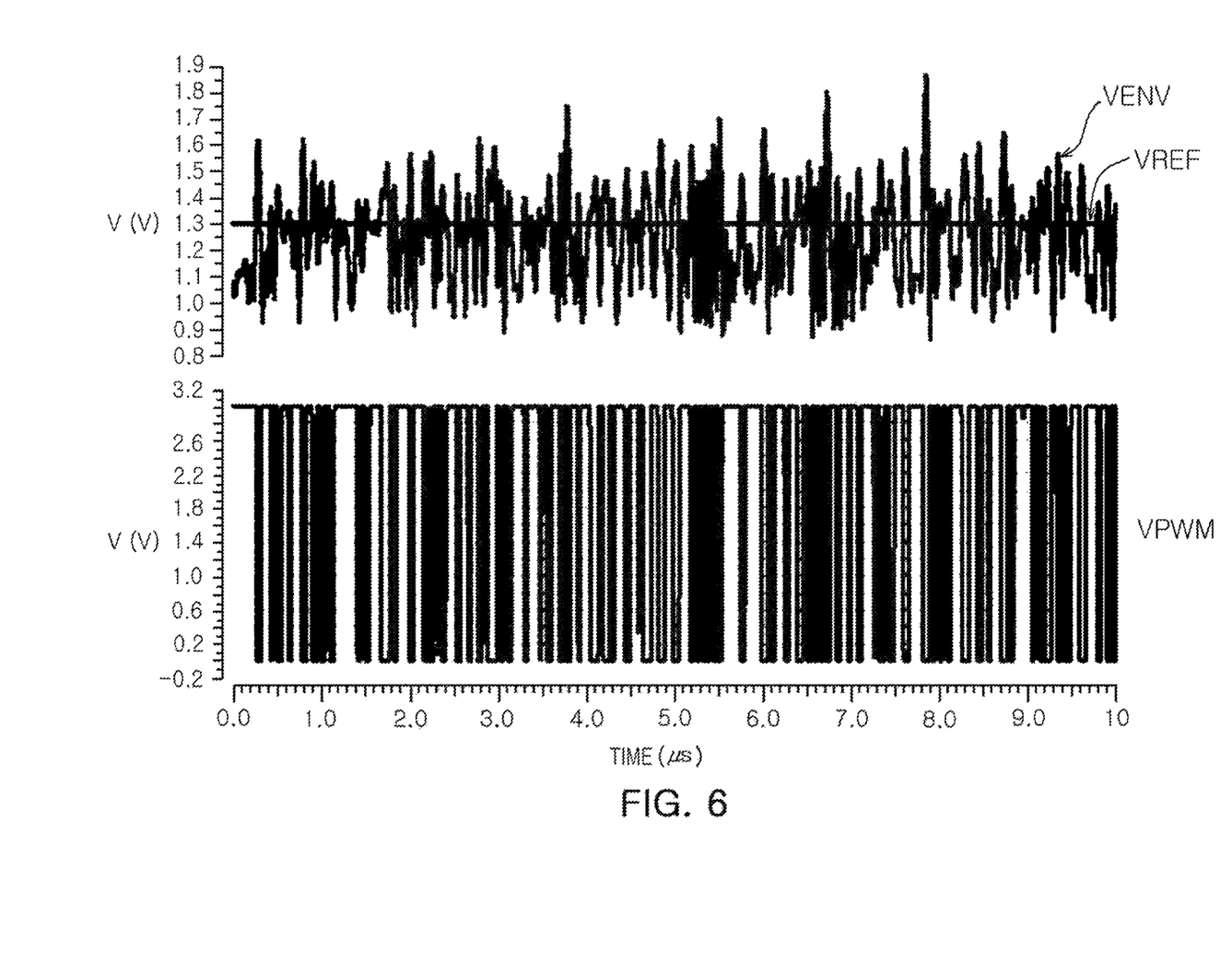
FIG. 6 is a diagram illustrating an envelope voltage, a reference voltage, and a pulse width modulation voltage of the example of FIG. 5.

FIG. 5 is a circuit diagram implementing the random pulse generation circuit of the example of FIG. 2 and FIG. 6 is a diagram illustrating an envelope voltage, a reference voltage, and a pulse width modulation voltage of the example of FIG. 5.

Referring to the examples of FIGS. 5 and 6, the rectifier 121, which is a rectifying circuit, includes a diode D1, a capacitor C1, and a resistor R1.

The rectifier 121, according to an example, is not limited to a half-wave rectifying circuit as illustrated in FIG. 5 and may include a full-wave rectifying circuit, and also may include any circuit that is able to generate the envelope voltage VENV having the envelope level of the RF signal.

As one example, the pulse width modulator 122 includes a reference voltage generation circuit 122-A1 and a pulse width modulation signal generation circuit 122-C1.

The reference voltage generation circuit 122-Al generates a reference voltage, as shown in FIG. 6, using the operating power VDD from the power circuit 101 and resistors R11 and R12. In one example, either one or both of two resistors R11 and R12 is a variable resistor. As an example, the resistor R12 is the variable resistor.

The pulse width modulation signal generation circuit 122-C1 compares the envelope voltage VENV, as shown in FIG. 6, received from the rectifier 121 and the reference voltage VREF received from the reference voltage generation circuit 122-A1 with each other to generate the pulse width modulation signal VPWM, as shown in FIG. 6, having the pulse width that is randomly varied.

As an example, the pulse width modulation signal generation circuit 122-C1 includes a first comparator COM1, and further includes a first inverter INT1.

In such an example, the first comparator COM1 receives as input the envelope voltage VENV through a non-inverting input terminal and receives as input the reference voltage VREF through an inverting input terminal to provide the pulse width modulation signal VPWM as having a high level in response to the envelope voltage VENV being higher than the reference voltage VREF, and as having a low level in response to the envelope voltage VENV being lower than the reference voltage VREF.

In this example, the pulse width modulation signal VPWM is a signal having the pulse width that is randomly changed according to the level of the envelope voltage VENV.

Accordingly, the first inverter INT1 inverts and provides the signal from the first comparator COM1.

FIG. 7 is a circuit diagram implementing the random pulse generation circuit of the example of FIG. 3 and FIG. 8 is a diagram illustrating first and second random switching signals of the example of FIG. 7.

Referring to the examples of FIGS. 3 and 7, the dead time controller 123 provides the first and second random switching signals SQ and SQB to the charge pump circuit 130 as illustrated in FIG. 3.

Referring to the example of FIG. 7, the dead time controller 123 generates the first and second random switching signals SQ and SQB having the dead time by connecting first, second, and third inverters IT1, 112, and IT3, and first and second NAND gates N1 and N2 with each other as illustrated in the example of FIG. 7.

Referring to the example of FIG. 8, the first random switching signal SQ is generated using the pulse width modulation signal VPWM, and the second random switching signal SQB is generated to invert the pulse width modulation signal VPWM and to have the dead time with respect to the first random switching signal SQ.

In such an example, the dead time of the first and second random switching signals SQ and SQB is a time that has a simultaneous switching-off level for the signals, for example, a low level, so that the first and second random switching signals SQ and SQB do not have a simultaneous switching-on level, for example, a high level, at a level shift time of the pulse signal.

Figure 9:
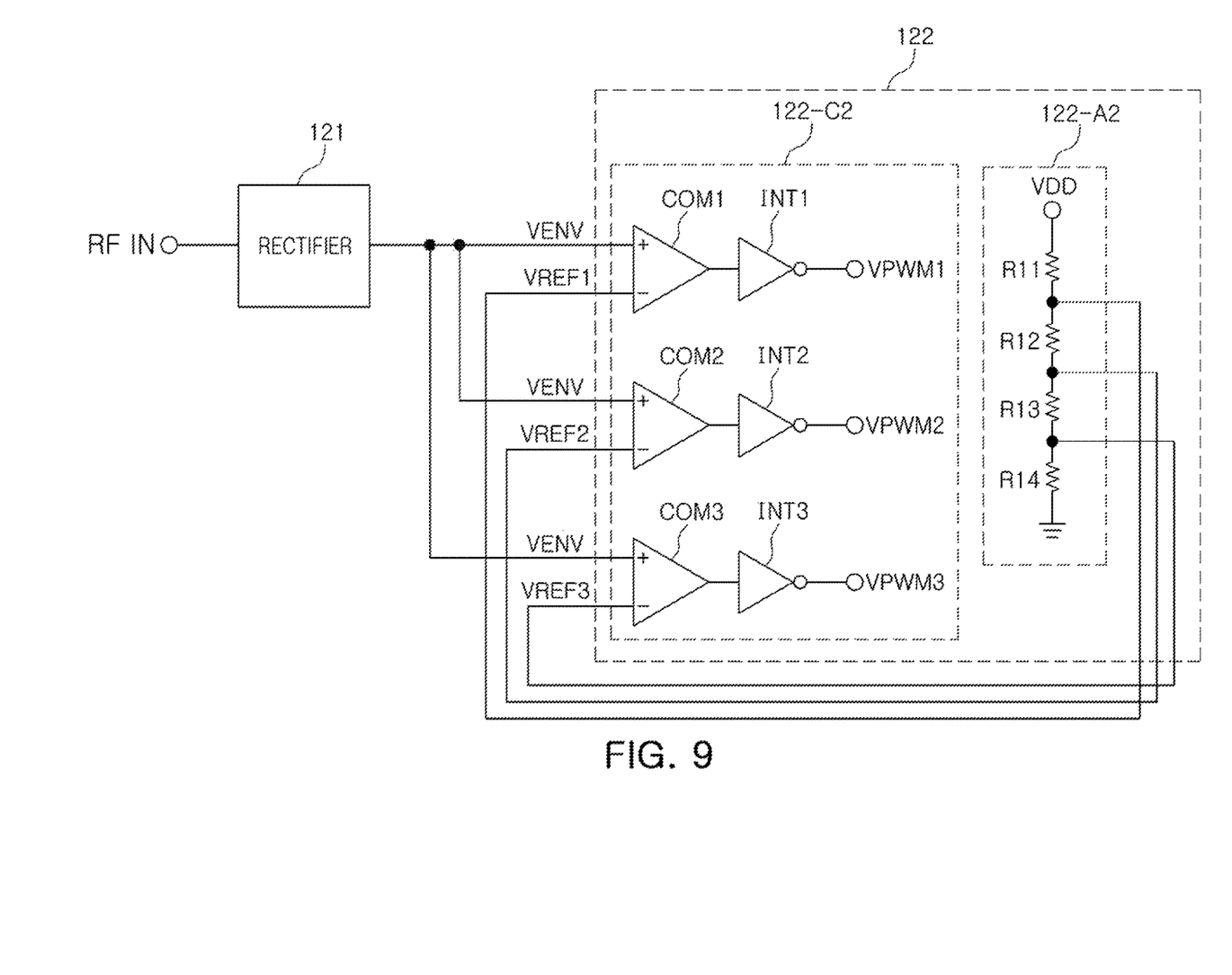
FIG. 9 is a circuit diagram implementing the random pulse generation circuit of the example of FIG. 4.

FIG. 9 is a circuit diagram implementing the random pulse generation circuit of the example of FIG. 4.

Referring to the example of FIG. 9, the pulse width modulator 122 includes a reference voltage generation circuit 122-A2 and a pulse width modulation signal generation circuit 122-C2.

For example, the reference voltage generation circuit 122-A2 generates reference voltages having different magnitudes.

As an example, the reference voltage generation circuit 122-A2 generates first, second, and third reference voltages VREF1, VREF2, and VREF3 having different magnitudes using the operating power VDD from the power circuit 101 and first, second, third, and fourth resistors R11, R12, R13, and R14.

The pulse width modulation signal generation circuit 122-C2 compares the envelope voltage VENV from the rectifier 121 and each of the reference voltages VREF1, VREF2, and VREF3 to generate pulse width modulation signals VPWM1, VPWM2, and VPWM3 having different pulse widths.

As an example, the pulse width modulation signal generation signal 122-C2 includes first, second, and third comparators COM1, COM2, and COM3, and further includes first, second, and third inverters INT1, INT2, and INT3.

As an example, the first comparator COM1 receives as input the envelope voltage VENV through the non-inverting input terminal and receives as input the first reference voltage VREF1 through the inverting input terminal to provide the first pulse width modulation signal VPWM1 having a high level in response to the envelope voltage VENV being higher than the first reference voltage VREF1 and having a low level in response to the envelope voltage VENV being lower than the first reference voltage VREF1.

As an example, the second comparator COM2 receives as input the envelope voltage VENV through the non-inverting input terminal and receives as input the second reference voltage VREF2 through the inverting input terminal to provide the second pulse width modulation signal VPWM2 having a high level in response to the envelope voltage VENV being higher than the second reference voltage VREF2 and having a low level in response to the envelope voltage VENV being lower than the second reference voltage VREF2.

In addition, the third comparator COM3 receives as input the envelope voltage VENV through the non-inverting input terminal and receives as input the third reference voltage VREF3 through the inverting input terminal to provide the third pulse width modulation signal VPWM3 having a high level in response to the envelope voltage VENV being higher than the third reference voltage VREF3 and having a low level in response to the envelope voltage VENV being lower than the third reference voltage VREF3.

In this example, the first, second, and third pulse width modulation signals VPWM1, VPWM2, and VPWM3 are signals having different pulse widths according to the level of the envelope voltage VENV.

Accordingly, the first, second, and third inverters INT1, INT2, and INT3 invert and provide the signals received from the first, second, and third comparators COM1, COM2, and COM3, respectively.

Referring to the examples of FIGS. 3, and 7 through 9, in response to the second reference voltage V2 being set to any voltage between the first reference voltage VREF1 and 0V, the third comparator COM3 generates a random pulse width modulation (PWM) signal having random pulse widths. In these examples, such a random PWM signal is used as the operation clock of the charge pump circuit 130 via the dead time controller (DTC) 123, as needed. In this example, the spurious signals of the charge pump circuit 130, which are generated by the operating clock, are dispersed in various small frequency components that correspond to the random pulse widths of the pulse signal.

Figure 10:
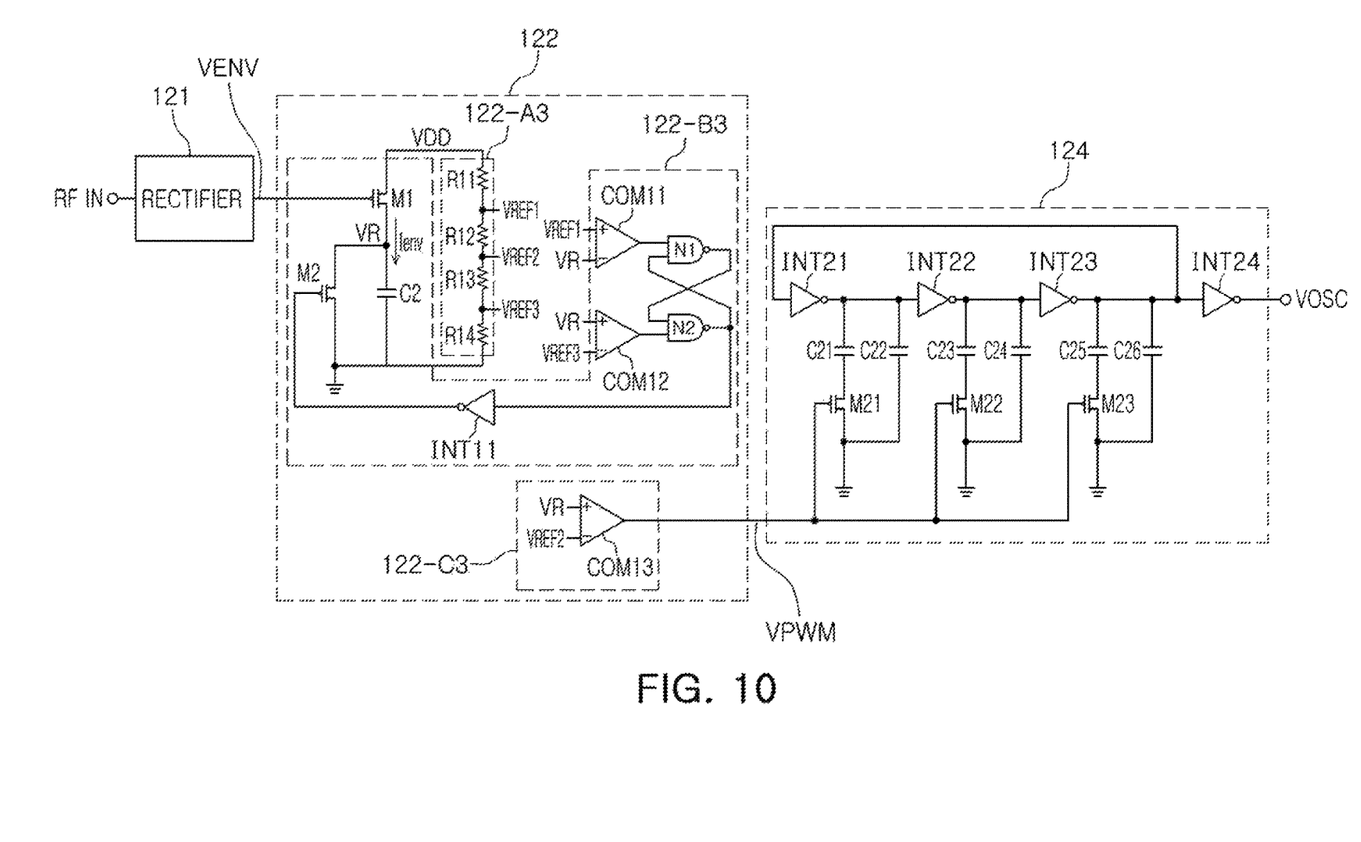
FIG. 10 is another circuit diagram implementing the random pulse generation circuit of the example of FIG. 4.

FIG. 10 is another circuit diagram implementing the random pulse generation circuit of the example of FIG. 4.

Referring to the example of FIG. 10, the pulse width modulator 122 includes a reference voltage generation circuit 122-A3, a sawtooth wave generation circuit 122-B3, and a pulse width modulation signal generation circuit 122-C3.

According to the example of FIG. 10, the reference voltage generation circuit 122-A3 generates reference voltages VREF1, VREF2, and VREF3 having different magnitudes.

As one example, the reference voltage generation circuit 122-A3 generates the first, second, and third reference voltages VREF1, VREF2, and VREF3 having different magnitudes using the operating power VDD from the power circuit 101 and the first, second, third, and fourth resistors R11, R12, R13, and R14.

In such an example, the sawtooth wave generation circuit 122-63 generates a sawtooth wave signal VR based on the envelope voltage VENV received from the rectifier 121.

As an example, the sawtooth wave generation circuit 122-B3 includes first and second comparators COM11 and COM12, first and second NAND gates N1 and N2, a first inverter INT11, a first MOS transistor M1, a capacitor C2, and a second MOS transistor M2, as illustrated in the example of FIG. 10.

The first MOS transistor M1, the capacitor C2, and the second MOS transistor M2 generate the sawtooth wave signal VR of a voltage form through the charging and discharging of the capacitor C2 while a current Ienv flows in the capacitor C2, according to an operation of the first MOS transistor M1 according to the envelope voltage VENV and an operation of the second MOS transistor M2 according to a gate voltage, as described further below.

The first and second comparators COM11 and COM12, the first and second NAND gates N1 and N2, and the first inverter INT11 generate the gate voltage of the second MOS transistor M2.

As an example, each of the first and second NAND gates N1 and N2 are the first NAND gate N1 that receives an output as an input and is cross-connected to the second NAND gate N2. In response to a voltage of the sawtooth wave signal VR being increased, in an example in which the voltage of the sawtooth wave signal VR exceeds the first reference voltage VREF1, an output of the second NAND gate N2 is changed, and in response to the voltage of the sawtooth wave signal VR being decreased, a value of the output of the second NAND gate N2 is maintained until the voltage of the sawtooth wave signal VR is decreased below the third reference voltage VREF3.

Therefore, in response to the voltage of the sawtooth wave signal VR exceeding the first reference voltage VREF1, the output of the second NAND gate N2 is inverted, and the inverted output of the second NAND gate N2 turns on the second MOS transistor M2 via the first inverter INT1 to discharge the capacitor C2.

With the repetition of such an operation as described further above, a voltage of the sawtooth wave signal VR appears in a sawtooth wave form, in which the voltage is changed from 0V to the first reference voltage VREF1, and a period of such a change is determined according to the envelope current Ienv. Because the envelope current Ienv has a value that is randomly changed according to the envelope of the RF signal in an example, the period of the sawtooth wave signal is also random in such an example.

In addition, the pulse width modulation signal generation circuit 122-C3 compares the sawtooth wave signal VR and the second reference voltage VREF2 to generate the pulse width modulation signals VPWM having different pulse widths.

As an example, the pulse width modulation signal generation circuit 122-C3 includes a third comparator COM13. The third comparator COM13 receives as input the sawtooth wave signal VR through the non-inverting input terminal and receives as input the second reference voltage VREF2 through the inverting input terminal to provide the pulse width modulation signal VPWM having a high level in response to the sawtooth wave signal VR being higher than the second reference voltage VREF2 and having a low level in response to the sawtooth wave signal VR being lower than the second reference voltage VREF2.

In such an example, the pulse width modulation signal VPWM is a signal having the pulse width that is randomly changed according to the level of the envelope voltage VENV or according to the level of the sawtooth wave signal VR.

As an example, the oscillator 124 includes a ring oscillator structure as illustrated in the example of FIG. 10. However, the circuit in the example of FIG. 10 illustrates merely one example of the oscillator 124, and the oscillator 120 is not limited to such a particular structure.

Referring to the example of FIG. 10, the oscillator 124 includes first, second, third, and fourth inverters INT21, INT22, INT23, and INT24 that are connected in series with each other, first to sixth capacitors C21 to C26 that are connected between each of connection nodes between the first, second, third, and fourth inverters INT21, INT22, INT23, and INT24, and a ground, and first, second, and third MOS transistors M21, M22, and M23 that are connected in series with some capacitors of the first to sixth capacitors C21 to C26 and perform a switching operation according to the pulse width modulation signal VPWM. In such an example, the first to sixth capacitors C21 to C26 optionally have different capacitance values.

Accordingly, each of the first, second, and third MOS transistors M21, M22, and M23 are operated in an on-state during different times over time according to the received pulse width modulation signal VPWM in order to have capacitance that is varied by the first to sixth capacitors C21 to C26 and in order to provide an oscillated signal VOSC of which an oscillated frequency is varied over time accordingly.

Figure 11:
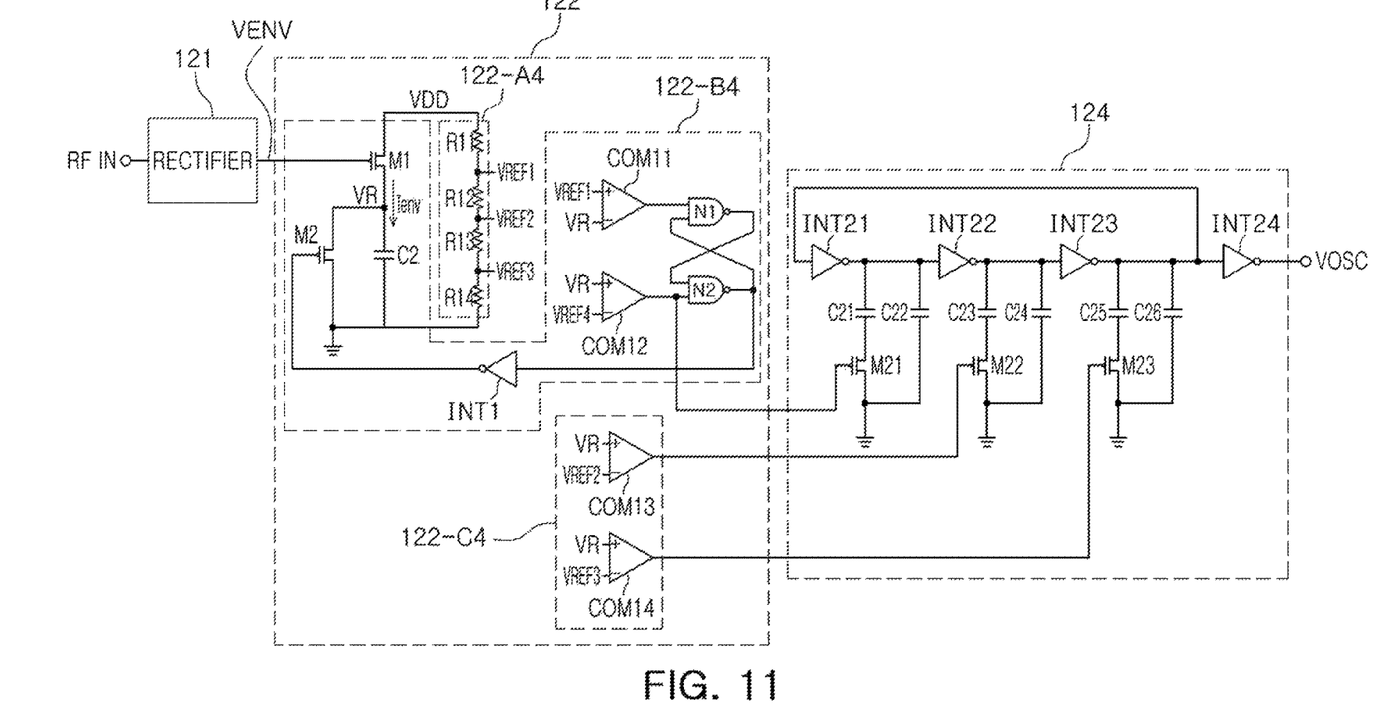
FIG. 11 is another circuit diagram implementing the random pulse generation circuit of the example of FIG. 4.
Figure 12:
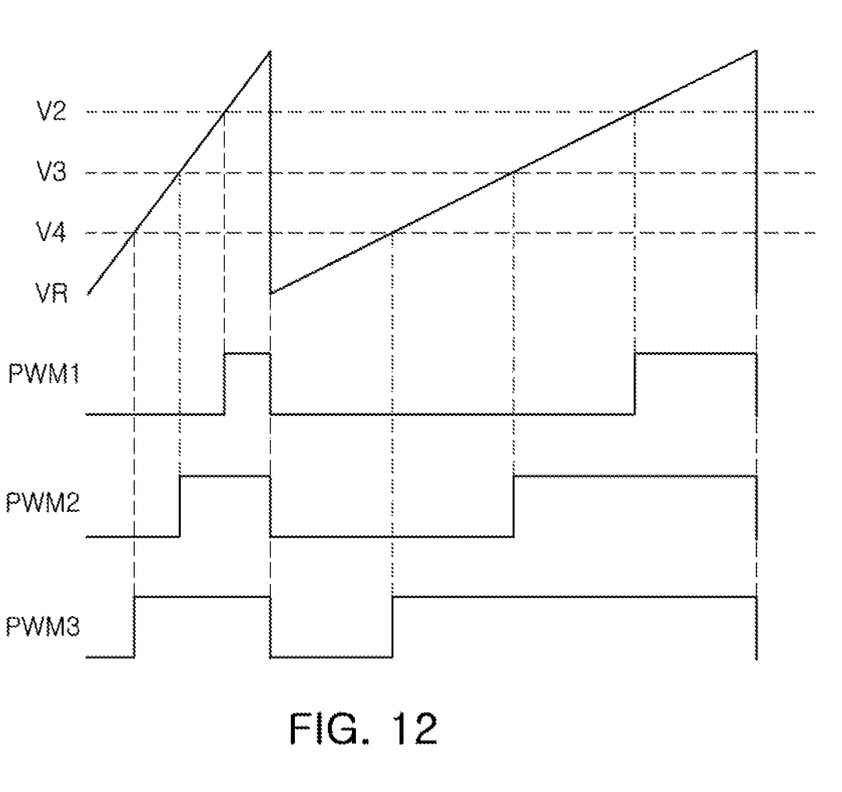
FIG. 12 is a diagram illustrating reference voltages, a sawtooth wave, and pulse width modulation signals of the example of FIG. 11.

FIG. 11 is another circuit diagram implementing the random pulse generation circuit of the example of FIG. 4 and FIG. 12 is a diagram illustrating reference voltages, a sawtooth wave, and pulse width modulation signals of the example of FIG. 11.

Referring to the examples of FIGS. 11 and 12, the pulse width modulator 122 includes a reference voltage generation circuit 122-A4, a sawtooth wave generation circuit 122-64, and a pulse width modulation signal generation circuit 122-C4.

In such examples, the reference voltage generation circuit 122-A4 generates reference voltages VREF1, VREF2, and VREF3 having different magnitudes.

As an example, referring to the examples of FIGS. 10 and 11, the reference voltage generation circuit 122-A4 generates first, second, and third reference voltages VREF1, VREF2, and VREF3, for example, see the example of FIG. 12, having different magnitudes using the operating power VDD from the power circuit 101 and first, second, third, and fourth resistors R11, R12, R13, and R14.

The sawtooth wave generation circuit 122-B4 generates a sawtooth wave signal VR based on the envelope voltage VENV received from the rectifier 121.

Referring to the examples of FIGS. 10 and 11, the sawtooth wave generation circuit 122-B4 includes the first and second comparators COM11 and COM12, the first and second NAND gates N1 and N2, the first inverter INT11, the first MOS transistor M1, the capacitor C2, and the second MOS transistor M2, as illustrated in the example of FIG. 11.

The first MOS transistor M1, the capacitor C2, and the second MOS transistor M2 generate the sawtooth wave signal VR through the charging and discharging of the capacitor C2 while a current Ienv flows in the capacitor C2, according to an operation of the first MOS transistor M1 according to the envelope voltage VENV and according to an operation of the second MOS transistor M2 according to a gate voltage, as described further below.

In such an example, the first and second comparators COM11 and COM12, the first and second NAND gates N1 and N2, and the first inverter INT11 generate the gate voltage of the second MOS transistor M2.

In addition, in this example the second comparator COM12 receives as input the sawtooth wave signal VR through the non-inverting input terminal and receives as input a fourth reference voltage VREF4 through the inverting input terminal to provide the first pulse width modulation signal VPWM1 having a high level in response to a voltage level of the sawtooth wave signal VR being higher than the fourth reference voltage VREF4 and having a low level in response to the voltage level of the sawtooth wave signal VR being lower than the fourth reference voltage VREF4.

In addition, referring to the example of FIG. 11, the pulse width modulation signal generation circuit 122-C4 compares the sawtooth wave signal VR and each of the second and third reference voltages VREF2 and VREF3 to generate the second and third pulse width modulation signals VPWM2 and VPWM3 having different pulse widths.

As an example, the pulse width modulation signal generation circuit 122-C3 includes third and fourth comparators COM13 and COM14. The third comparator COM13 receives as input the sawtooth wave signal VR through the non-inverting input terminal and receives as input the second reference voltage VREF2 through the inverting input terminal to provide the second pulse width modulation signal VPWM2 having a high level in response to the voltage level of the sawtooth wave signal VR being higher than the second reference voltage VREF2 and having a low level in response to the voltage level of the sawtooth wave signal VR being lower than the second reference voltage VREF2.

In addition, the fourth comparator COM14 receives as input the sawtooth wave signal VR through the non-inverting input terminal and receives as input the third reference voltage VREF3 through the inverting input terminal to provide the third pulse width modulation signal VPWM3 having a high level in response to the voltage level of the sawtooth wave signal VR being higher than the third reference voltage VREF3 and having a low level in response to the voltage level of the sawtooth wave signal VR being lower than the third reference voltage VREF3.

In this example, the first, second, and third pulse width modulation signals VPWM1, VPWM2, and VPWM3 are signals, see the example of FIG. 12, having different pulse widths according to the level of the envelope voltage VENV or the level of the sawtooth wave signal VR. Accordingly, FIG. 12 illustrates how the voltage levels of such signals change over time.

As an example, the oscillator 124 include a ring oscillator structure as illustrated in the example of FIG. 10, and the circuit in FIG. 11 illustrates merely one example of such an oscillator 124, and is not limited to such a particular example.

Referring to the example of FIG. 11, the oscillator 124 includes first, second, third, and fourth inverters INT21, INT22, INT23, and INT24 that are connected in series with each other, first to sixth capacitors C21 to C26 that are connected between each of connection nodes between the first, second, third, and fourth inverters INT21, INT22, INT23, and INT24, and a ground, and first, second, and third MOS transistors M21, M22, and M23 that are connected in series with some capacitors of the first to sixth capacitors C21 to C26 and perform a switching operation according to each of the first, second, and third pulse width modulation signals VPWM1, VPWM2, and VPWM3.

Accordingly, each of the first, second, and third MOS transistors M21, M22, and M23 are operated in an on-state during different times according to the first, second, and third pulse width modulation signals VPWM1, VPWM2, and VPWM3 in order to have capacitance that is varied by the first to sixth capacitors C21 to C26 and to provide an oscillated signal VOSC of which an oscillated frequency is varied over time accordingly.

As set forth above, according to the examples, in the example in which the PWM signal based on the envelope is used, because the time division duplex (TDD) mode uses the same frequency, the problem of the generated spurious signals of the charge pump is prevented.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power amplifying apparatus, comprising:
a power circuit configured to generate operating power;
a random pulse generation circuit configured to receive the operating power and to generate a pulse width modulation signal of which a pulse width is randomly changed over time based on an input radio frequency (RF) signal; and
a charge pump circuit configured to receive the operating power and to randomly perform a switching operation based on the pulse width modulation signal,
wherein the random pulse generation circuit comprises a rectifier configured to rectify the input RF signal to provide an envelope voltage having an envelope level of the RF signal.

2. The power amplifying apparatus of claim 1, wherein the random pulse generation circuit comprises:
a rectifier configured to rectify the input RF signal to provide an envelope voltage having an envelope level of the RF signal; and
a pulse width modulator configured to provide the pulse width modulation signal of which the pulse width is randomly varied based on the envelope voltage provided by the rectifier.

3. The power amplifying apparatus of claim 2, wherein the random pulse generation circuit further comprises a dead time controller configured to provide first and second random switching signals having an antiphase with respect to each other and having a dead time with respect to the charge pump circuit based on the pulse width modulation signal.

4. The power amplifying apparatus of claim 2, wherein the pulse width modulator comprises:
a reference voltage generation circuit configured to generate a reference voltage; and
a pulse width modulation signal generation circuit configured to compare the envelope voltage from the rectifier and the reference voltage with each other to generate the pulse width modulation signal of which the pulse width is randomly varied.

5. The power amplifying apparatus of claim 1, wherein the random pulse generation circuit further comprises:
a pulse width modulator configured to provide pulse width modulation signals of which the pulse width is randomly varied according to the envelope voltage from the rectifier; and
an oscillator configured to provide an oscillated signal according to a random charging and discharging operation based on the pulse width modulation signals.

6. The power amplifying apparatus of claim 5, wherein the pulse width modulator comprises:
a reference voltage generation circuit configured to generate reference voltages having different magnitudes; and
a pulse width modulation signal generation circuit configured to compare the envelope voltage from the rectifier and each of the reference voltages to generate pulse width modulation signals having different pulse widths.

7. The power amplifying apparatus of claim 5, wherein the pulse width modulator comprises:
a reference voltage generation circuit configured to generate reference voltages having different magnitudes;

a sawtooth wave generation circuit configured to generate a sawtooth wave signal based on the envelope voltage from the rectifier; and a pulse width modulation signal generation circuit configured to compare the sawtooth wave signal and each of the reference voltages to generate pulse width modulation signals having different pulse widths.

8. The power amplifying apparatus of claim 5, wherein the oscillator is a ring oscillator comprising metal-oxide-semiconductor (MOS) transistors each configured to operate in an on-state during different times based on the pulse width modulation signals.

9. The power amplifying apparatus of claim 5, wherein the rectifier comprises a diode, a capacitor, and a resistor.

10. A power amplifying apparatus, comprising:

a power circuit configured to generate operating power;

a bias circuit configured to receive the operating power and to generate a bias signal;

a random pulse generation circuit configured to receive the operating power and to generate a pulse width modulation signal of which a pulse width is randomly changed over time with an input radio frequency (RF) signal;

a charge pump circuit configured to receive the operating power and to randomly perform a switching operation according to the pulse width modulation signal;

a power amplifier configured to receive the operating power and the bias signal, and to amplify the input RF signal; and a band selection switch configured to perform a band selection operation based on the operating power and the negative voltage, and to transfer the input RF signal from the power amplifier, wherein the random pulse generation circuit comprises a rectifier configured to rectify the input RF signal to provide an envelope voltage having an envelope level of the RF signal.

11. The power amplifying apparatus of claim 10, wherein the random pulse generation circuit comprises:

a rectifier configured to rectify the input RF signal to provide an envelope voltage having an envelope level of the RF signal; and a pulse width modulator configured to provide the pulse width modulation signal of which the pulse width is randomly varied according to the envelope voltage from the rectifier.

12. The power amplifying apparatus of claim 10, wherein the random pulse generation circuit further comprises:

a pulse width modulator configured to provide pulse width modulation signals of which the pulse width is randomly varied according to the envelope voltage from the rectifier; and an oscillator configured to provide an oscillated signal according to a random charging and discharging operation based on the pulse width modulation signals.

13. The power amplifying apparatus of claim 12, wherein the oscillator is a ring oscillator comprising metal-oxide-semiconductor (MOS) transistors each configured to operate in an on-state during different times based on the pulse width modulation signals.

14. The power amplifying apparatus of claim 12, wherein the rectifier comprises a diode, a capacitor, and a resistor.

15. The power amplifying apparatus of claim 10, wherein the random pulse generation circuit further comprises a dead time controller configured to provide first and second random switching signals having an antiphase with respect to each other and having a dead time with respect to the charge pump circuit based on the pulse width modulation signal.

16. The power amplifying apparatus of claim 15, wherein the pulse width modulator comprises:

a reference voltage generation circuit configured to generate a reference voltage; and a pulse width modulation signal generation circuit configured to compare the envelope voltage from the rectifier and the reference voltage with each other to generate the pulse width modulation signal of which the pulse width is randomly varied.

17. The power amplifying apparatus of claim 16, wherein the pulse width modulator comprises:

a reference voltage generation circuit configured to generate reference voltages having different magnitudes; and a pulse width modulation signal generation circuit configured to compare the envelope voltage from the rectifier and each of the reference voltages to generate pulse width modulation signals having different pulse widths.

18. The power amplifying apparatus of claim 16, wherein the pulse width modulator comprises:

a reference voltage generation circuit configured to generate reference voltages having different magnitudes;

a sawtooth wave generation circuit configured to generate a sawtooth wave signal based on the envelope voltage from the rectifier; and a pulse width modulation signal generation circuit configured to compare the sawtooth wave signal and each of the reference voltages to generate pulse width modulation signals having different pulse widths.

19. The power amplifying apparatus of claim 1, wherein the charge pump circuit is further configured to randomly perform the switching operation based on the pulse width modulation signal generate a negative voltage.

20. The power amplifying apparatus of claim 10, wherein the charge pump circuit is further configured to randomly perform the switching operation based on the pulse width modulation signal generate a negative voltage.

* * * * *